(12) United States Patent
Kowtun et al.

(10) Patent No.: US 11,489,275 B1
(45) Date of Patent: Nov. 1, 2022

(54) ELECTRICAL UNIT

(71) Applicant: Lear Corporation, Southfield, MI (US)

(72) Inventors: Peter Kowtun, Plymouth, MI (US); Christopher J. Darr, Livonia, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 17/333,982

(22) Filed: May 28, 2021

(51) Int. Cl.
| | | |
|---|---|---|
| *H01R 12/75* | (2011.01) | |
| *H01R 13/506* | (2006.01) | |
| *H01R 13/639* | (2006.01) | |
| *H05K 5/00* | (2006.01) | |
| *H01R 13/04* | (2006.01) | |

(52) U.S. Cl.
CPC ............. *H01R 12/75* (2013.01); *H01R 13/04* (2013.01); *H01R 13/506* (2013.01); *H01R 13/639* (2013.01); *H05K 5/0026* (2013.01); *H01R 2201/26* (2013.01)

(58) Field of Classification Search
CPC ...... H01R 12/75; H01R 13/04; H01R 13/506; H01R 13/639; H05K 5/0026
See application file for complete search history.

(56) References Cited

U.S. PATENT DOCUMENTS

| | | |
|---|---|---|
| 9,293,852 B2 | 3/2016 | Glick et al. |
| 9,525,254 B2 | 12/2016 | Chen |
| 9,608,369 B1 | 3/2017 | Brandt et al. |
| 10,135,168 B2 | 11/2018 | Pavlovic et al. |
| 10,283,917 B1 | 5/2019 | Darr et al. |
| 2019/0123522 A1* | 4/2019 | Darr .................... H01H 85/2045 |
| 2019/0305445 A1* | 10/2019 | Yamaguchi ............ H01R 24/38 |
| 2020/0388950 A1* | 12/2020 | Shimizu ............... H01R 13/645 |

FOREIGN PATENT DOCUMENTS

| | | | | |
|---|---|---|---|---|
| CN | 110459901 A | * | 11/2019 | |
| CN | 112192519 A | * | 1/2021 | ............... B25F 5/00 |
| JP | 6482963 B2 | | 3/2019 | |
| WO | 20154330 A1 | | 7/2020 | |

OTHER PUBLICATIONS

Lear Corporation, 2009, High Power Terminals & Connectors MAK8 & MAK12, MAK Terminal & Connector Overview, Global Electerical + Electronics.

* cited by examiner

*Primary Examiner* — Tho D Ta
(74) *Attorney, Agent, or Firm* — Fishman Stewart PLLC

(57) ABSTRACT

An electrical connector may include an L-shaped body portion and a base portion. The body portion may include (i) a first body portion extending in a first direction, and (ii) a second body portion extending from the first body portion in a second direction. The base portion may include a protrusion configured to engage a projection of a housing member to releasably connect the base portion to said housing member. The first body portion may be connected to the base portion to define an internal space in which a first electrical component and a second electrical component are electrically connectable to each other. The base portion may at least partially define a first opening via which said first electrical component is insertable into the internal space. The second body portion may include a second opening via which said second electrical component is insertable into the internal space.

20 Claims, 12 Drawing Sheets

ELECTRICAL UNIT

TECHNICAL FIELD

The present disclosure generally relates to electrical units, including power distribution boxes (PDBs) that may, for example, be used in connection with vehicles.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical units may be utilized in connection with separate assemblies, which may necessitate additional electrical connectors, cables, terminals, and/or wiring harnesses. Some electrical units, however, are difficult and/or complex to assemble with the electrical connectors, cables, terminals, and/or wiring harnesses.

There is a desire for solutions/options that minimize or eliminate one or more challenges or shortcomings of electrical units. The foregoing discussion is intended only to illustrate examples of the present field and is not a disavowal of scope.

SUMMARY

In embodiments, an electrical connector may include an L-shaped body portion and a base portion. The body portion may include (i) a first body portion extending substantially in a first direction, and (ii) a second body portion extending from the first body portion substantially in a second direction oblique or perpendicular to the first direction. The base portion may include a protrusion configured to engage a complimentary projection of a housing member to releasably connect the base portion to said housing member. The first body portion may be releasably connected to the base portion to define an internal space in which a first electrical component and a second electrical component are electrically connectable to each other. The base portion may at least partially define a first opening via which said first electrical component is insertable into the internal space in the first direction. The second body portion may include a second opening via which said second electrical component is insertable into the internal space in the second direction.

In embodiments, an electrical unit may include a housing member, an internal housing assembly, and an electrical connector. The housing member may include a projection. The internal housing assembly may include a circuit board. The electrical connector may include a generally L-shaped body portion and a base portion. The body portion may include (i) a first body portion extending generally in a first direction, and (ii) a second body portion extending from the first body portion generally in a second direction that extends oblique or perpendicular to the first direction. The base portion may include a protrusion configured to engage the projection of the housing member to releasably connect the electrical connector to the housing member. The first body portion may be releasably connected to the base portion to define an internal space in which a first electrical component and a second electrical component are electrically connectable to each other. The base portion may at least partially define a first opening via which said first electrical component is insertable into the internal space in the first direction. The circuit board may include the second electrical component. The second body portion may include a second opening via which at least a portion of the second electrical component is insertable into the internal space in the second direction.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and embodiments are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
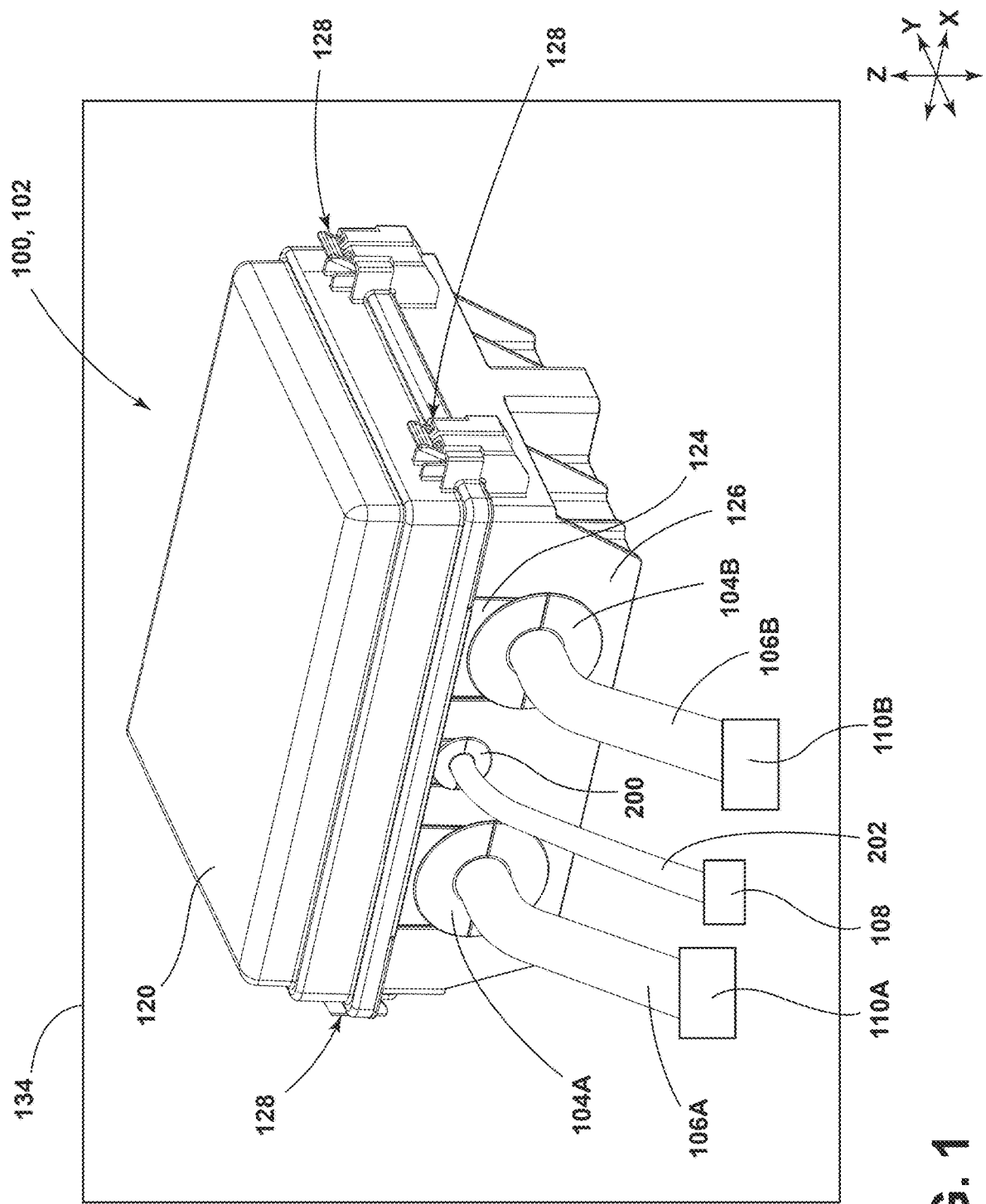
FIG. 1 is a perspective view generally illustrating an embodiment of an electrical unit according to teachings of the present disclosure.
Figure 2:
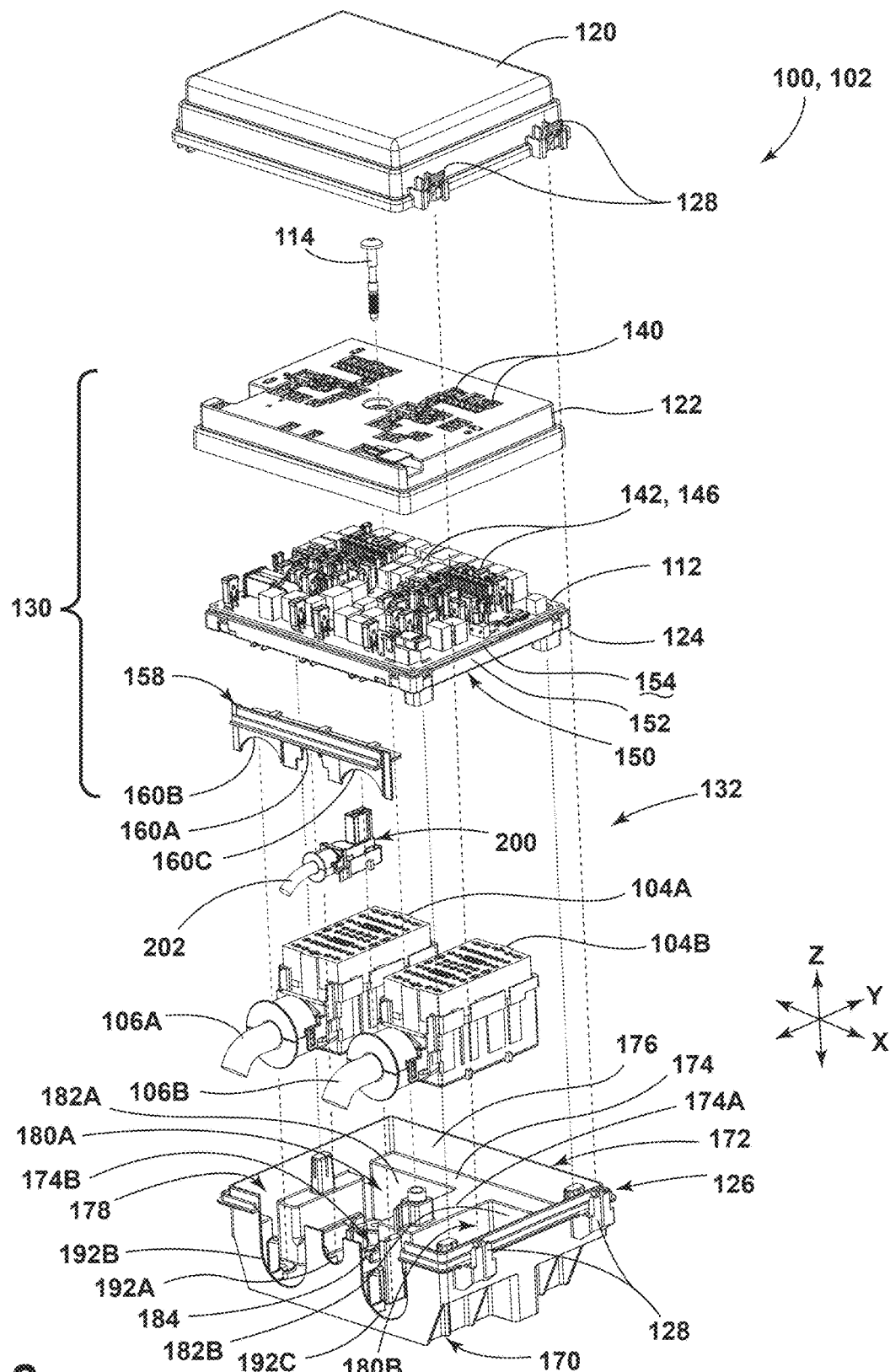
FIG. 2 is an exploded view generally illustrating an embodiment of an electrical unit according to teachings of the present disclosure.

With embodiments, such as generally illustrated in FIGS. 1 and 2, an electrical unit 100 may include an electrical unit housing 102. An electrical unit 100 may include and/or be connected to one or more electrical connectors 200. An electrical unit 100 may include and/or be connected to one or more electrical connector assemblies, such as a first electrical connector assembly 104A and/or a second electrical connector assembly 104B. An electrical connector 200 may be connected with a first electrical component 202 (see, e.g., FIGS. 1 and 2) and/or a second electrical component 204 (see, e.g., FIG. 3). The first electrical connector assembly 104A may be connected with a first cable 106A. The second electrical connector assembly 104B may be connected with a second cable 106B. In embodiments, an electrical unit 100 may be configured as a power distribution unit (PDU) and/or a power distribution box (PDB). For example, the electrical connector 200 and/or the first electrical component 202 may be configured to provide electrical power to the electrical unit 100, such as from a power source 108 (e.g., a battery, such as a vehicle battery). In some examples, the power source 108 may be a battery and/or the first electrical component 202 may be configured as a power cable, a positive terminal of the battery, etc. The electrical unit 100 may be configured to receive and/or distribute the electrical power to one or more other components 110A, 110B (e.g., vehicle components/systems), such as via the first electrical connector assembly 104A and the first cable 106A and/or the second electrical connector assembly 104B and the second cable 106B. A first electrical connector assembly 104A and/or a second electrical connector assembly 104B may, for example and without limitation, include a plurality of terminals (e.g., 30 or more) that may correspond to respective wires of cables 106A, 106B that may be connected to respective systems and/or components.

In embodiments, such as generally illustrated in FIG. 2, an electrical unit 100 may include an electrical unit housing 102, a circuit board 112, and/or one or more fasteners 114. The electrical unit housing 102 may include a first/external cover 120, a second/internal cover 122, a first/external housing member 126, a second/internal housing member 124, and/or one or more connectors 128 (e.g., mechanical connectors). The first cover 120 may be connected to the first housing member 126, such as to define an internal space 132. The second cover 122, the circuit board 112, and/or the second housing member 124 may be connectable, such as to form an inner housing assembly 130, which may be connectable to the housing member 126. The second cover 122, the circuit board 112, the second housing member 124, one or more electrical connector assemblies 104A, 104B, an electrical connector 200, and/or a fastener 114 may be disposed partially and/or entirely in the internal space 132. The cover 120, the second cover 122, the circuit board 112, the second housing member 124, the electrical connector assemblies 104A, 104B, the electrical connector 200, and/or the housing member 126 may, in some configurations, be disposed in a stacked and/or overlapping configuration. For example, a housing member 126 may be disposed on and/or connected to a mounting surface 134 (see, e.g., FIG. 1). The electrical connector assemblies 104A, 104B and/or the electrical connector 200 may be disposed at least partially above/on top of the housing member 126. The second housing member 124 may disposed at least partially above/on top of the electrical connector assemblies 104A, 104B, the electrical connector 200, and/or the housing member 126. The circuit board 112 may be disposed at least partially above/on top of portions of the second housing member 124. The second cover 122 may be disposed at least partially above/on top of the circuit board 112 (e.g., such that the circuit board 112 is disposed substantially between the second cover 122 and the second housing member 124 forming the inner housing assembly 130). The cover 120 may be disposed at least partially above/on top of the second cover 122. In some configurations, the second housing member 124 may be disposed at least partially in the housing member 126, and/or the circuit board 112 may be disposed at least partially in the second housing member 124.

With embodiments, such as generally illustrated in FIGS. 1 and 2, a cover 120 may be releasably connectable to a housing member 126 via one or more connectors 128. A cover 120 may include a generally rectangular or rectangular prism configuration (e.g., with an open end), among other possible configurations.

Figure 3:
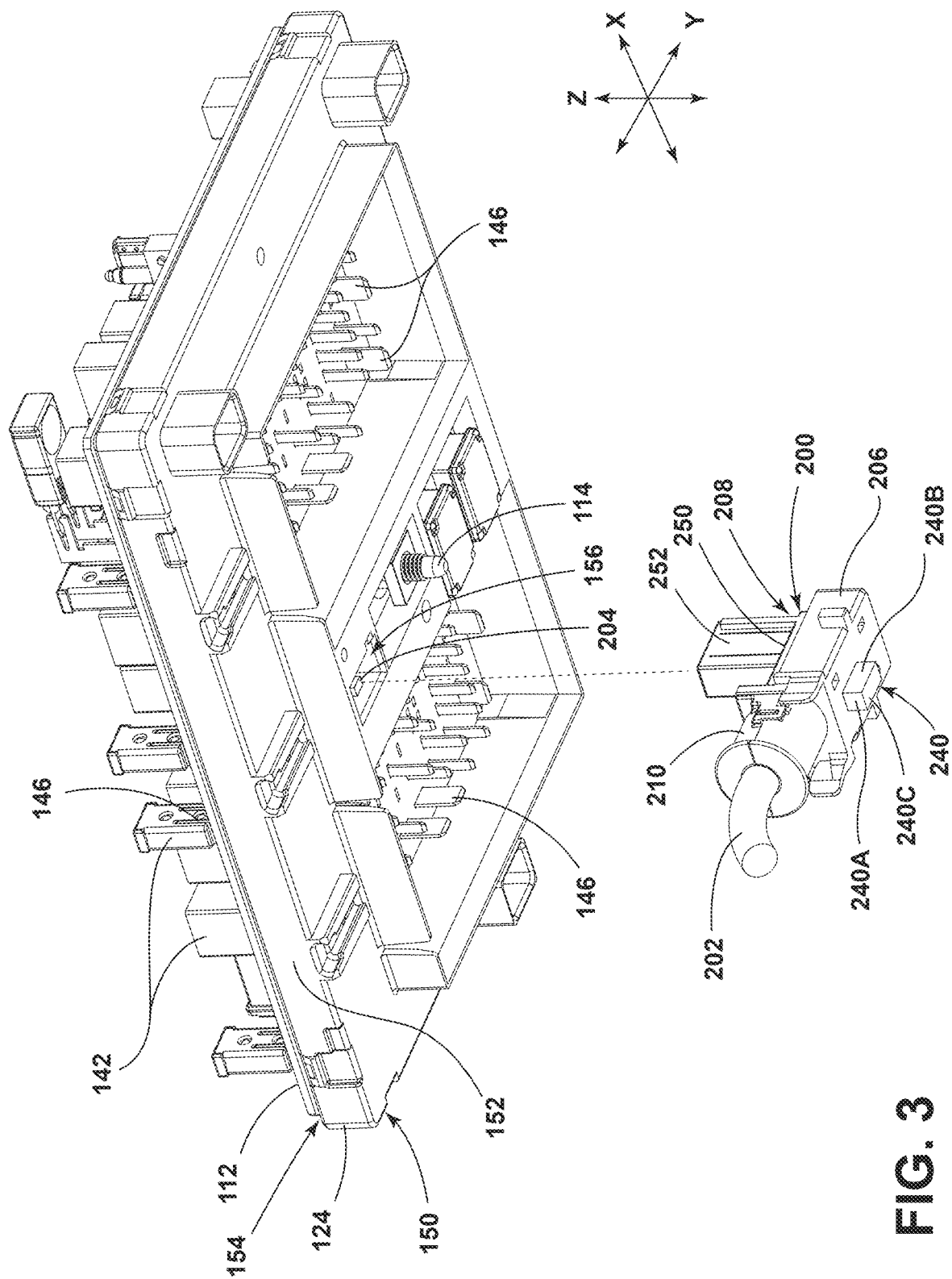
FIG. 3 is a exploded view generally illustrating portions of an embodiment of an electrical unit according to teachings of the present disclosure.

With embodiments, such as generally illustrated in FIGS. 2 and 3, a second cover 122 may include a generally rectangular or rectangular prism configuration (e.g., with an open bottom), among other possible configurations. A second cover 122 may include one or more apertures 140, which may, for example, be configured to at least partially receive respective fuses or other electrical component 142 (e.g., blade fuses).

In embodiments, such as generally illustrated in FIGS. 2 and 3, a circuit board 112 may, for example, include a generally rectangular configuration that may correspond to the configuration of the second cover 122 and/or the second housing member 124. One or more electrical components 146 may be connected to the circuit board 112. The one or more electrical components 146 may include one or more of a variety of components, such as relays, controllers, capacitors, resistors, inductors, and/or diodes, among others. The circuit board 112 and/or one or more electrical components 146 thereof may include and/or may be electrically connected to the second electrical component 204 (e.g., a substantially planar terminal). The second electrical component 204 may be connected to and/or extend from the circuit board 112 toward the housing member 126 (e.g., generally downward in a Z-direction) and/or may be configured to engage and/or be inserted into the electrical connector 200. The one or more electrical components 146 may, at least in part, be configured to facilitate distribution of electrical power received via the electrical connector 200, the first electrical component 202, and/or the second electrical component 204 to the first electrical connector assembly 104A, the first cable 106A, the second electrical connector assembly 104B, and/or the second cable 106B.

In embodiments, such as generally illustrated in FIGS. 2 and 3, a second/internal housing member 124 may be releasably connectable to a second/internal cover 122, such as to at least partially enclose a circuit board 112 and form an inner housing assembly 130. A second housing member 124 may include a generally rectangular prism configuration (e.g., with an open end), among other possible configurations. A second housing member 124 may include a base 150 and/or one or more walls 152. A base 150 may extend substantially perpendicular to a Z-direction. One or more walls 152 may extend from the base 150 generally in a Z-direction. The base 150 and/or one or more walls 152 may surround and/or at least partially define an internal space 154 of the second housing member 124. A second housing member 124 and/or a base 150 thereof may include and/or define a connector receptacle 156, which may be configured to engage and/or receive at least a portion of an electrical connector 200 (e.g., at least a portion of a second body portion 252). A connector receptacle 156 may open generally toward a housing member 126 (e.g., generally downward in a Z-direction). At least a portion of a second electrical component 204 may project through the second housing member 124 (e.g., generally downward in a Z-direction) and/or may be disposed within the connector receptacle 156. The second electrical component 204 may or may not extend beyond the connector receptacle 156.

As generally illustrated in FIG. 2, a second housing member 124 may include a connector portion 158 having a first connector recess 160A, a second connector recess 160B, and/or a third connector recess 160C that may be configured to at least partially receive an electrical connector 200, a first electrical connector assembly 104A, and/or a second electrical connector assembly 104B, respectively. The second housing member 124 and/or the connector portion 158 may be disposed (e.g., moved down) over an electrical connector 200, a first electrical connector assembly 104A, and/or a second electrical connector assembly 104B such that top portions of the electrical connector 200 and/or the electrical connector assemblies 104A, 104B are disposed in the recesses 160A, 160B, 160C.

Figure 6A:
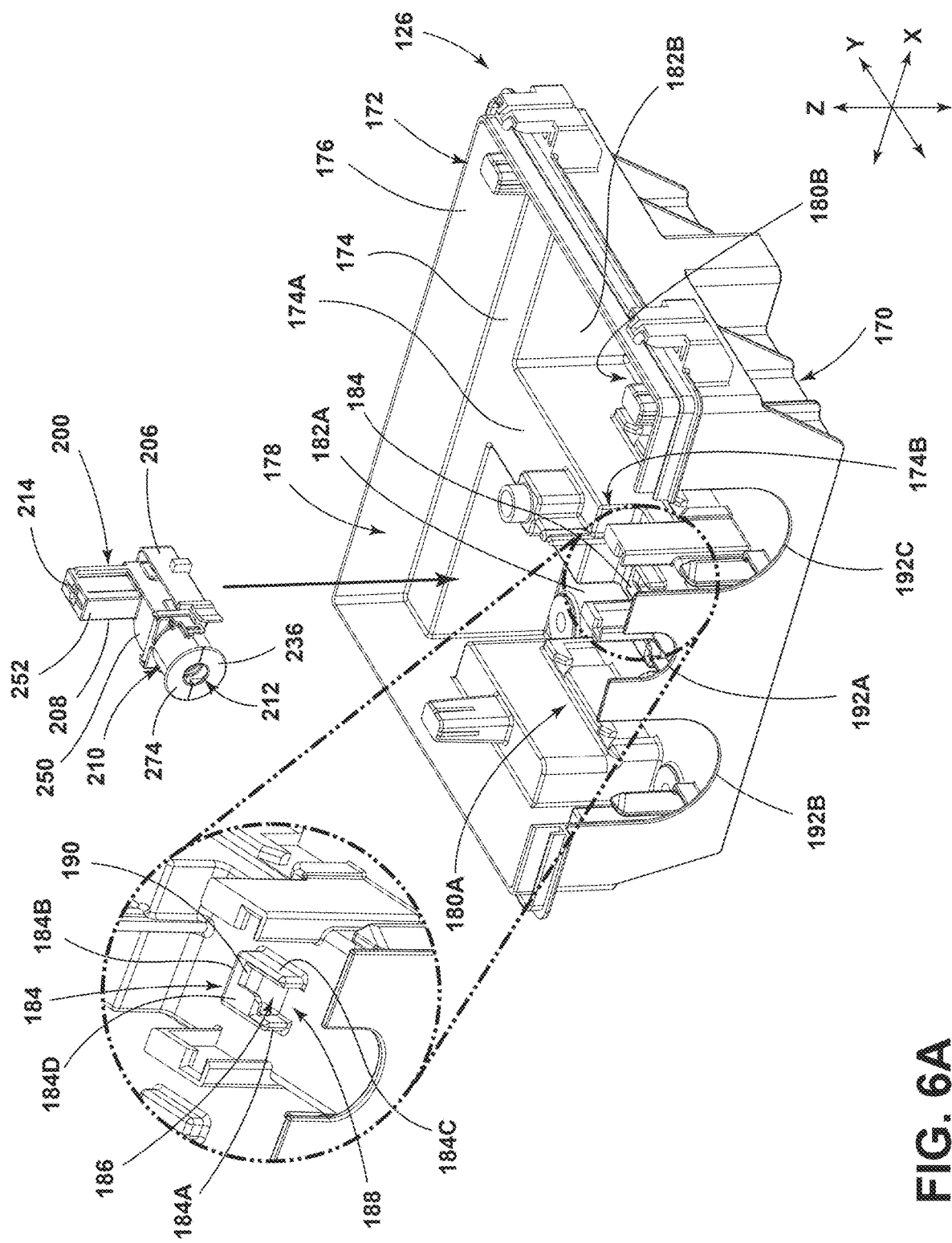
FIGS. 6A-6E are views generally illustrating an embodiment of a method of assembling an electrical unit according to teachings of the present disclosure.
Figure 6B:
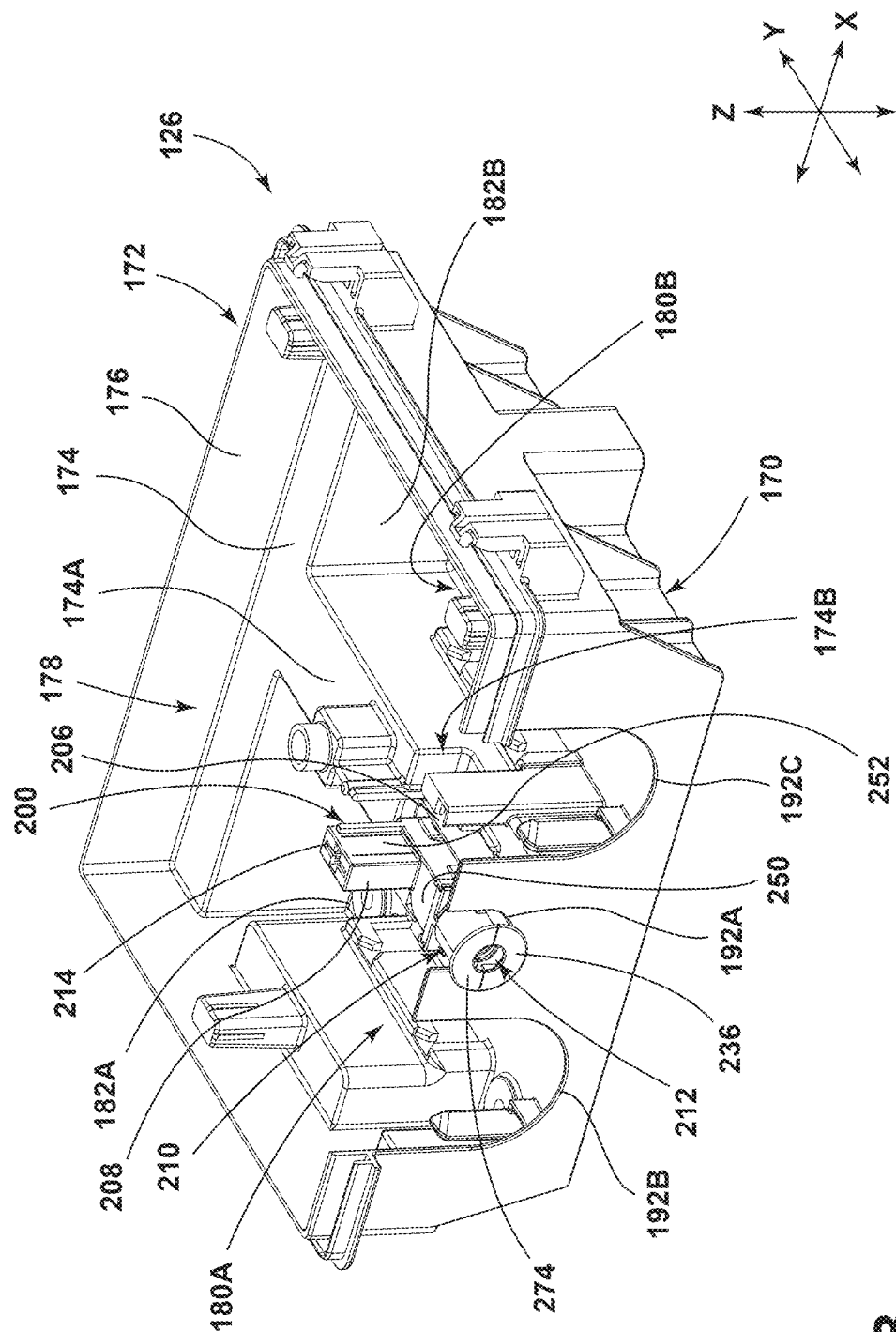

In embodiments, such as generally illustrated in FIGS. 2, 6A, and 6B, a housing member 126 may include a generally rectangular configuration, among other possible configurations. A housing member 126 may have a closed end 170 and an open end 172, which may be disposed opposite the closed end 172 (e.g., relative to a Z-direction). A housing member 126 may include a support portion 174 and/or one or more wall portions 176. A support portion 174 may define the closed end 170 of the housing member 126 and/or may extend substantially perpendicular to a Z-direction. One or more wall portions 176 may extend from the support portion 174 generally parallel to a Z-direction. The support portion 174 and/or one or more wall portions 176 may surround and/or at least partially define an interior space 178 of the housing member 126.

In embodiments, such as generally illustrated in FIGS. 2, 6A, and 6B, a housing member 126 may include one or more assembly receptacles (e.g., a first assembly receptacle 180A, a second assembly receptacle 180B), which may be configured to at least partially receive the first electrical connector assembly 104A and/or the second electrical connector assembly 104B. An assembly receptacle 180A, 180B may be disposed in and/or at least partially defined by the support portion 174 and/or an assembly portion 182A, 182B of the housing member 126. A housing member 126 may include one or more assembly portions (e.g., a first assembly portion 182A, a second assembly portion 182B). An assembly portion 182A, 182B may project from the support portion 174 of the housing member 126, such as generally downward in a Z-direction.

In embodiments, such as generally illustrated in FIGS. 2 and 6A-6D, a support portion 174 may include a section 174A extending generally in a Y-direction. The section 174A of the support portion 174 may be disposed at least partially between the assembly receptacles 180A, 180B and/or the assembly portions 182A, 182B, and/or may separate the assembly receptacles 180A, 180B and/or the assembly portions 182A, 182B from each other generally in an X-direction. The section 174A may include a depression 174B configured to receive the electrical connector 200. The depression 174B may be disposed (e.g., directly) adjacent to a wall portion 176 and/or a first connector recess 192A. The depression 174B may have a depth generally in a Z-direction that is less than a depth of the assembly receptacles 180A, 180B generally in the Z-direction.

Figure 6C:
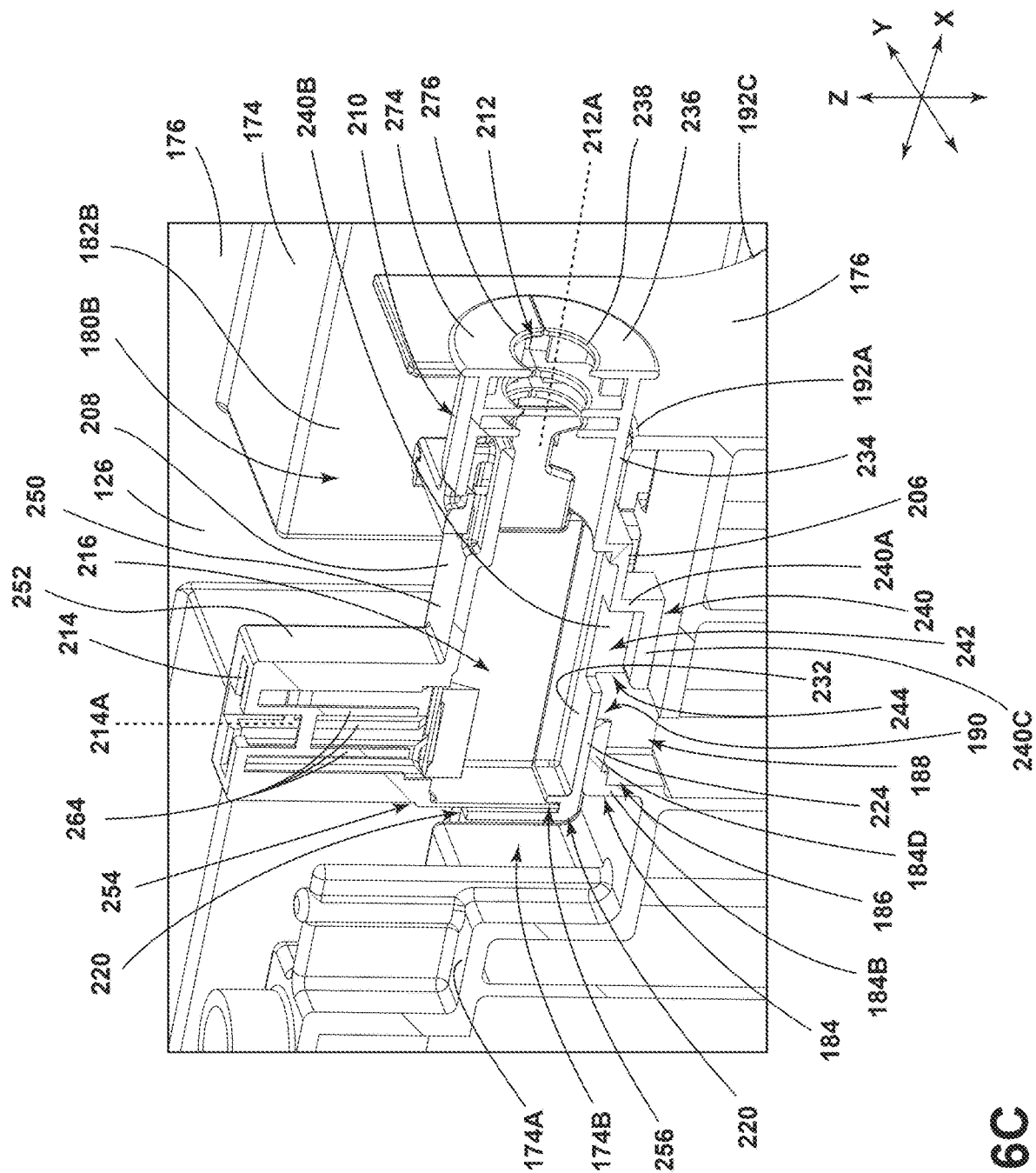
Figure 6D:
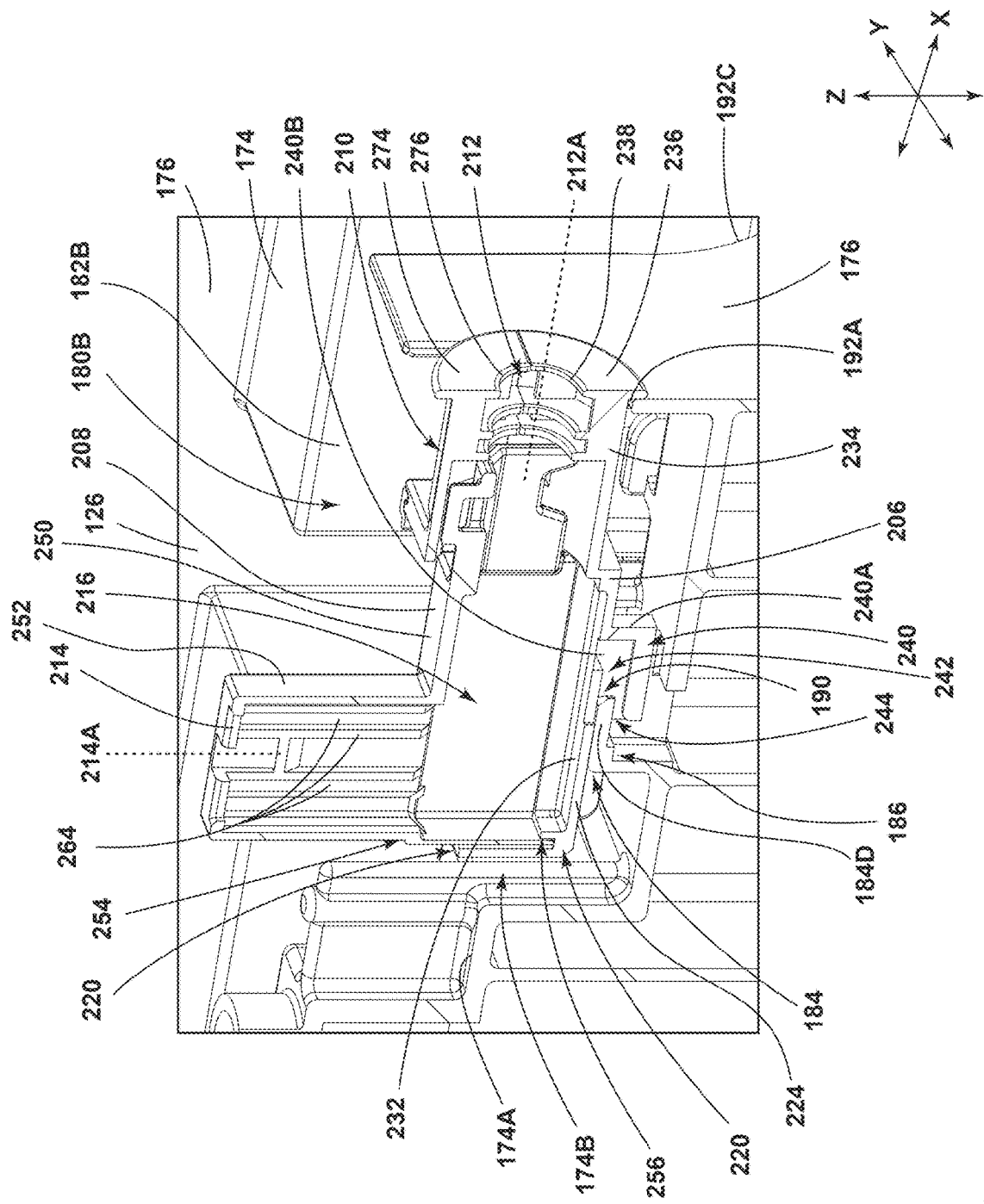

In embodiments, such as generally illustrated in FIGS. 6A, 6C, and 6D, a housing member 126 may include one or more projections 184, which may be configured to engage an electrical connector 200 (e.g., a protrusion 240 and/or a receptacle 242). A projection 184 may be disposed on and/or connected to the support portion 174 of the housing member 126, the section 174A of the support portion 174, and/or in the depression 174B. A projection 184 may have one or more portions (e.g., a first portion 184A, a second portion 184B, a third portion 184C, and/or a fourth portion 184D), which may define a receptacle 186 and/or an opening 188. One or more portions 184A-184C may extend generally upward in a Z-direction, may be disposed in a U-shaped configuration (e.g., viewed from a Z-direction), and/or may be connected to one another via the fourth portion 184D, which may extend obliquely and/or perpendicularly to the Z-direction. A projection 184 may have a generally U-shaped cross-section as viewed in a Y-direction. The opening 188 may face/open generally in a Y-direction (e.g., toward a first connector recess 192A) and/or facilitate insertion of at least a portion of a protrusion 240 (e.g., a second portion 240B and/or a third portion 240C) of an electrical connector 200 into the receptacle 186 (e.g., generally in a Y-direction). A slot 190 may be disposed in the fourth portion 184D, which may be configured to receive a portion of the protrusion 240 (e.g., a second portion 240B). The slot 190 may extend into the fourth portion 184D (e.g., generally in a Y-direction) from the opening 188.

In embodiments, such as generally illustrated in FIGS. 2, 6A, 6B, and 6E, a housing member 126 may include a first connector recess 192A, a second connector recess 192B, and/or a third connector recess 192C that may be configured to at least partially receive the electrical connector 200, the first electrical connector assembly 104A, and/or the second electrical connector assembly 104B. For example and without limitation, the connector recesses 192A, 192B, 192C may be disposed in a first side of the housing member 126, and an electrical connector 200, a first electrical connector assembly 104A, and/or a second electrical connector assembly 104B may be moved down such that at least bottom portions of the electrical connectors 104A, 104B are disposed in the corresponding recess 192A, 192B, 192C. With some configurations, the housing member 126 may be referred to as a retainer and/or may be configured for mounting an electrical unit 100 on a mounting surface 134.

With embodiments, such as generally illustrated in FIGS. 2-5B and 6F, an electrical connector 200 may be configured to receive and/or releasably retain at least a portion of one or more electrical components (e.g., a first electrical component 202 and/or a second electrical component 204) and/or to facilitate connecting (e.g., electrically) one or more electrical components 202, 204 together. An electrical connector 200 may be releasably connectable to one or more portions of an electrical unit housing 102, such as by engaging a projection 184 of the housing member 126. In at least some examples, an electrical connector 200 may include a base portion 206, a body portion 208, and/or a cover portion 210, which may be releasably connectable to one another to form the electrical connector 200 (see, e.g., FIG. 4). An electrical connector 200 may include and/or define an internal space 216. An electrical connector 200 may include a first opening 212 via which at least a portion of a first electrical component 202 (e.g., a power cable, a battery terminal, etc.) may be inserted into an internal space 216 of the electrical connector 200. An electrical connector 200 may include a second opening 214 via which at least a portion of a second electrical component 204 (e.g., a planar/blade terminal, a busbar, etc.) may be inserted into an internal space 216 of the electrical connector 200. A central longitudinal axis 212A of the first opening 212 and/or a central longitudinal axis 214A of the second opening 214 may extend parallelly, obliquely, or perpendicularly to each other. For example, the axis 212A may extend generally parallel to a Y-direction and/or the axis 214A may extend generally parallel to a Z-direction. Within the electrical connector 200 and/or the internal space 216, a first electrical component 202 and/or a second electrical component 204 may be electrically connected to one another directly (e.g., may directly contact one another) and/or indirectly, such as via one or more conductors and/or a conductor assembly 218 (e.g., a terminal or terminals) of the electrical connector 200.

Figure 6E:
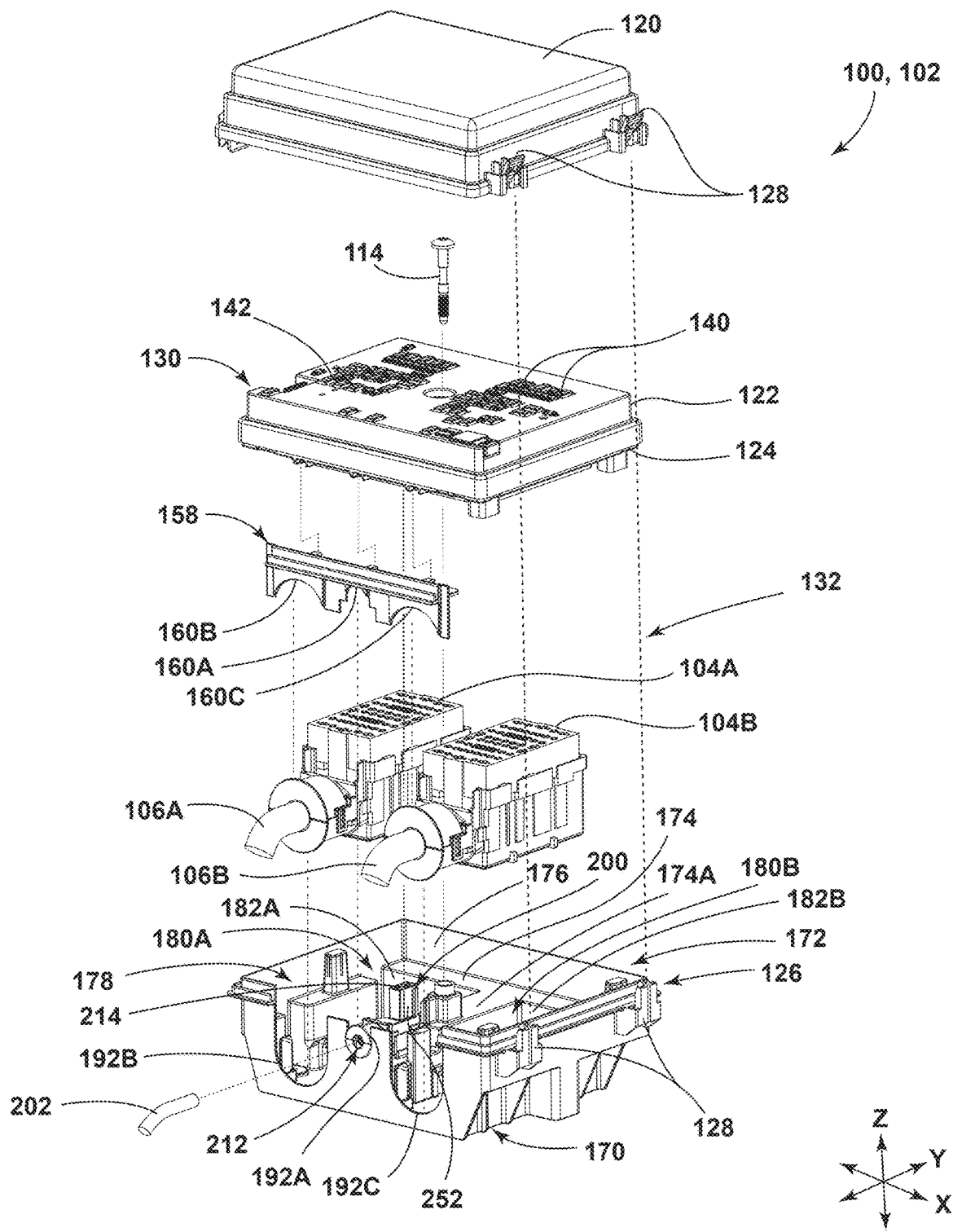
Figure 6F:
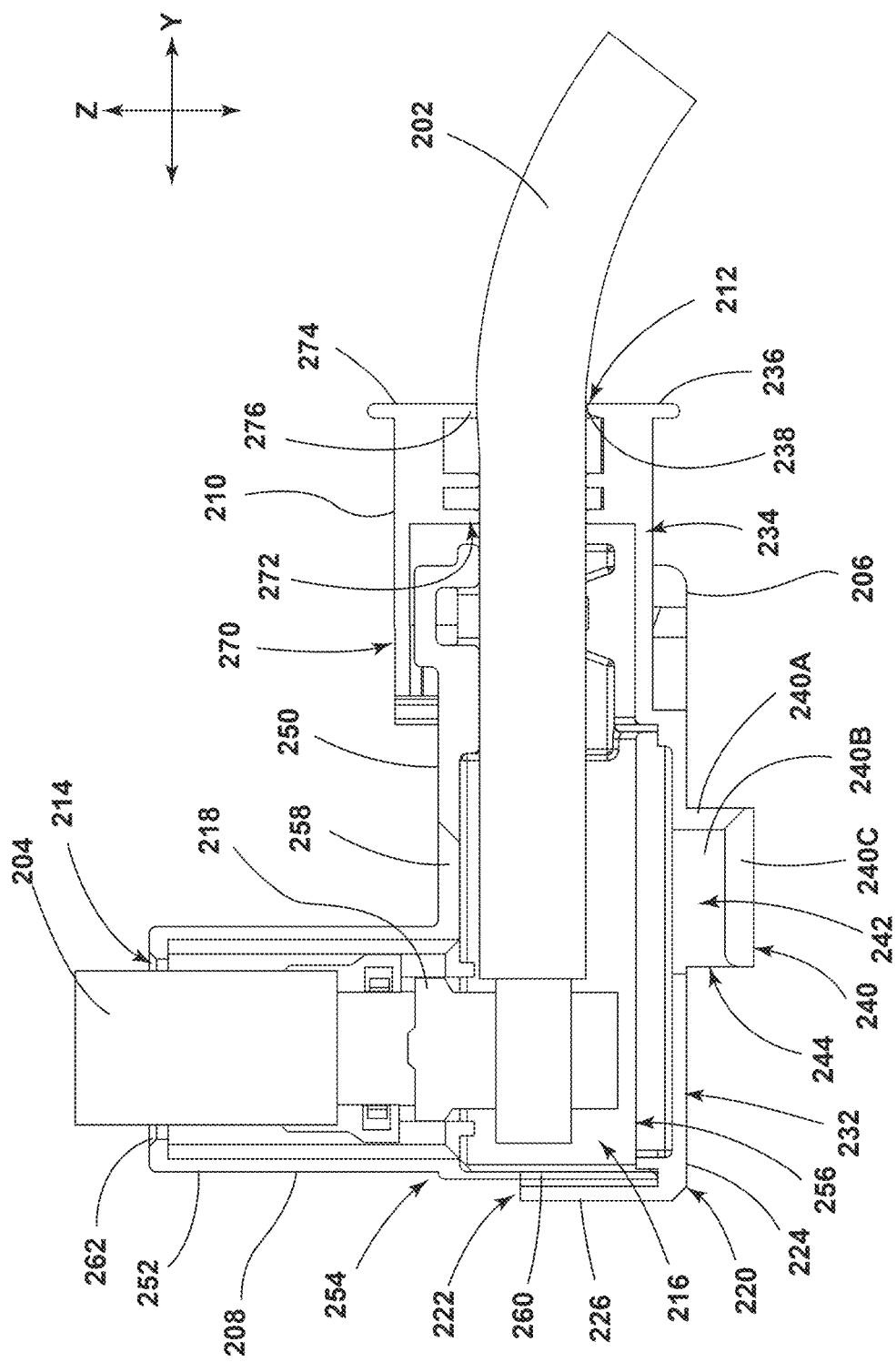
FIG. 6F is a cross-sectional view generally illustrating an embodiment of an electrical connector according to teachings of the present disclosure.

With embodiments, such as generally illustrated in FIG. 6F, an electrical connector 200 may, in at least some examples, include one or more conductors and/or a conductor assembly 218 configured to mechanically and/or electrically connect a first electrical component 202 and/or a second electrical component 204. The one or more conductors and/or the conductor assembly 218 may be disposed at least partially in the internal space 216, the base portion 206, the body portion 208, and/or the cover portion 210. Additionally and/or alternatively, the one or more conductors and/or the conductor assembly 218 may be connected to the base portion 206, the body portion 208 (e.g., the first body portion 250 and/or the second body portion 252), and/or the cover portion 210.

Figure 4:
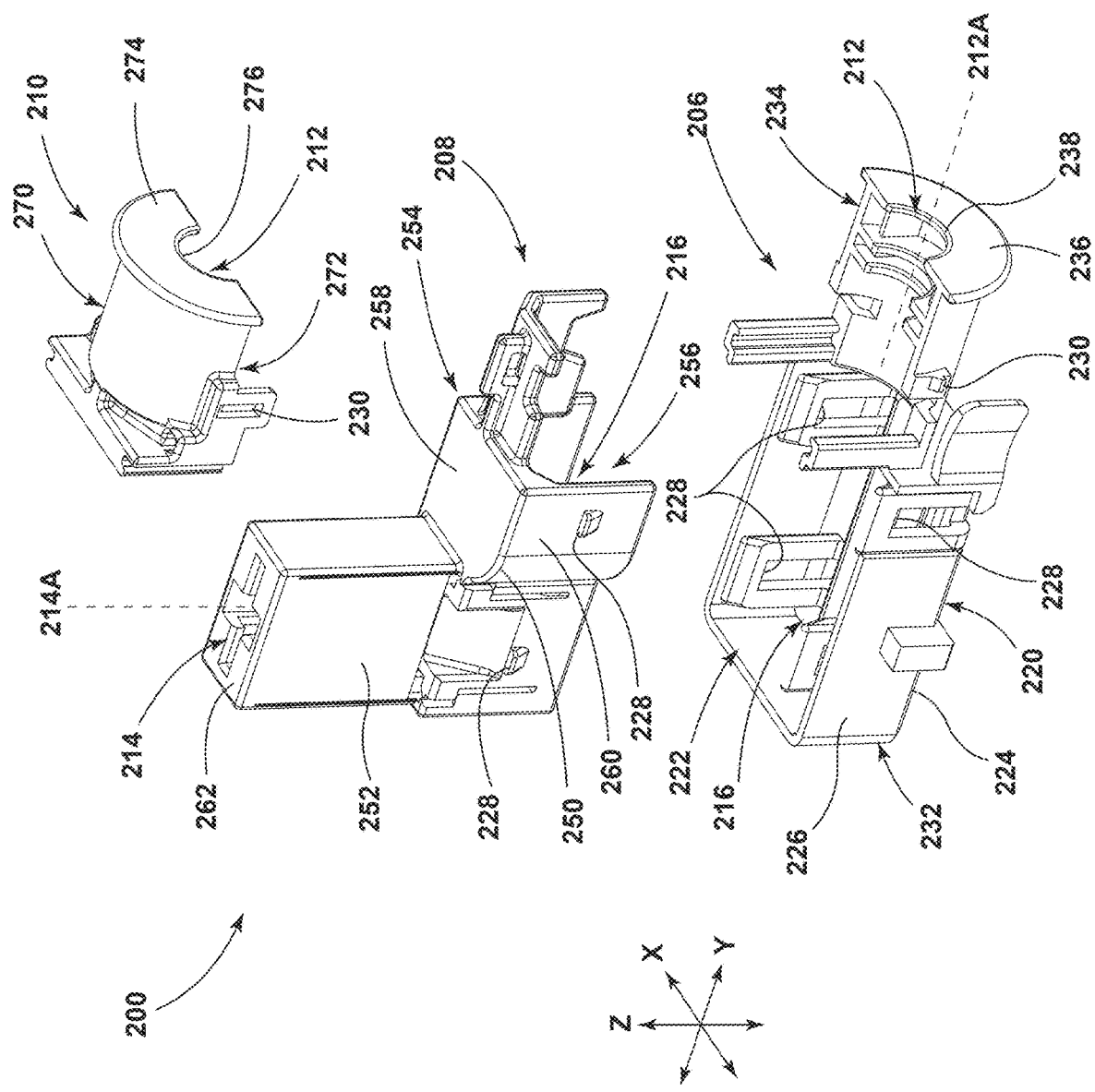
FIG. 4 is an exploded view generally illustrating an embodiment of an electrical connector according to teachings of the present disclosure.
Figure 5A:
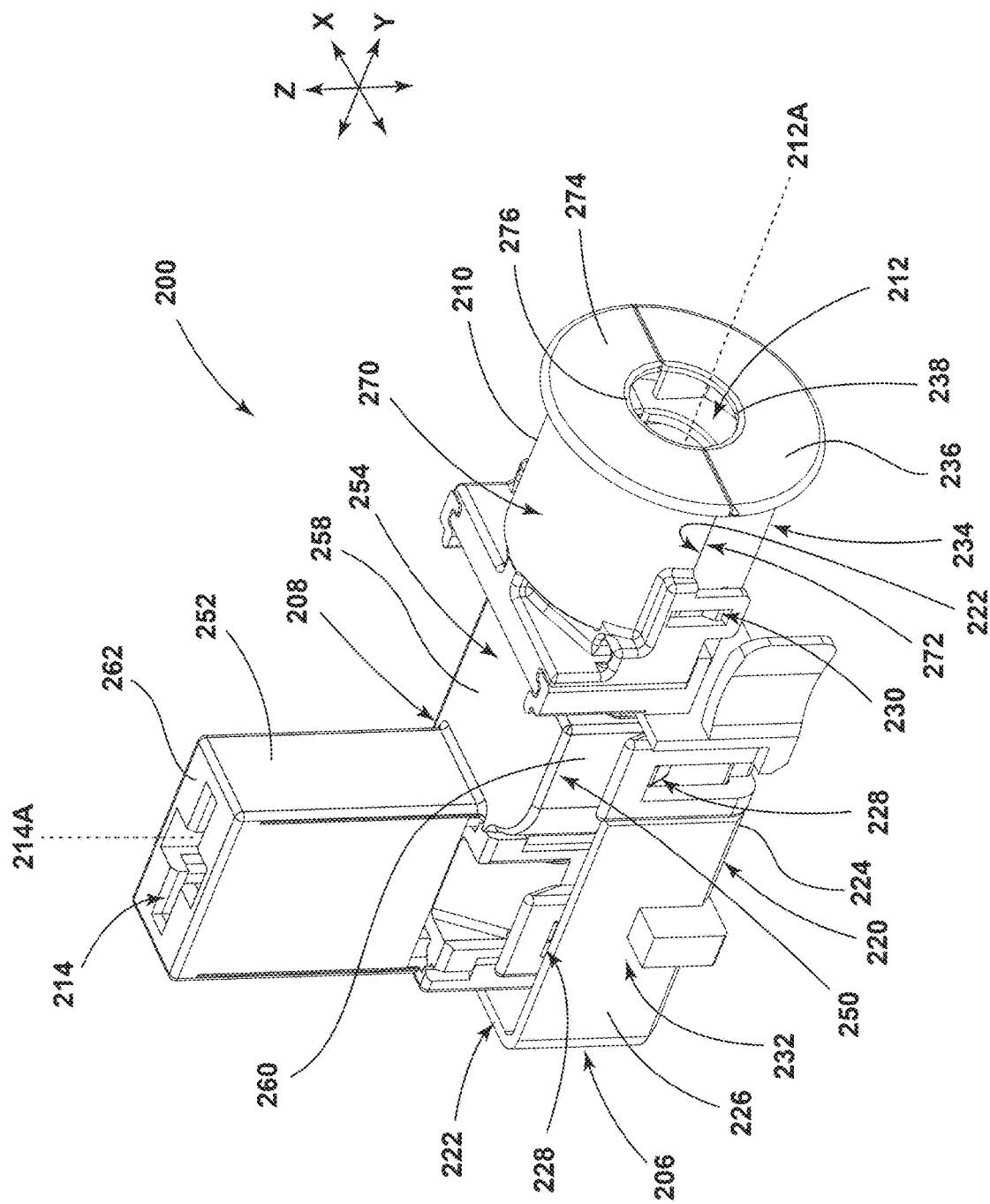
FIGS. 5A and 5B are perspective views generally illustrating an embodiment of an electrical connector according to teachings of the present disclosure.

With embodiments, such as generally illustrated in FIGS. 4 and 5A, a base portion 206 may have a closed end 220 and an open end 222, which may be disposed opposite the closed end 220 (e.g., relative to a Z-direction). A base portion 206 may be releasably connectable to a body portion 208 via one or more mechanical connections (e.g., snap-fit connections) and/or connectors 228. A base portion 206 may be releasably connectable to a cover portion 210 via one or more mechanical connections (e.g., snap-fit connections) and/or connectors 230. An open end 222 of a base portion 206 may be configured to engage and/or at least partially receive a body portion 208 (e.g., an open end 256 of a body portion 208) and/or a cover portion 210. A base portion 206 may include a first portion 232 and/or a second portion 234. A first portion 232 may have a generally cuboid/rectangular prism configuration. A first portion 232 may include a base 224 and/or one or more walls 226. A base 224 may at least partially define the closed end 220 of the base portion 206 and/or may extend substantially perpendicular to a Z-direction. One or more walls 226 may extend from the base 224 generally in a Z-direction. The base 224 and/or one or more walls 226 may surround and/or at least partially define an internal space 216 of the electrical connector 200. A first portion 232 may have a generally U-shaped profile as viewed in a Y-direction. A second portion 234 may have a generally hollow semicylindrical configuration and/or may extend from a first portion 232, such as generally in a Y-direction. A second portion 234 may be connected to and/or integrally formed with the first portion 232. A second portion 234 may include an end wall 236, which may be disposed opposite the first portion 232 (e.g., relative to a Y-direction) and/or may lie substantially perpendicular to the Y-direction. The base portion 206 and/or the end wall 236 may include a recess 238 that may be configured to at least partially receive the first electrical component 202. For example, the recess 238 may extend into the end wall 236 (e.g., generally in a Z-direction), such as from an edge of the end wall 236, and/or may have a semicircular shape. The recess 238 may form at least a portion of a first opening 212 (e.g., a lower half) of an electrical connector 200.

Figure 5B:
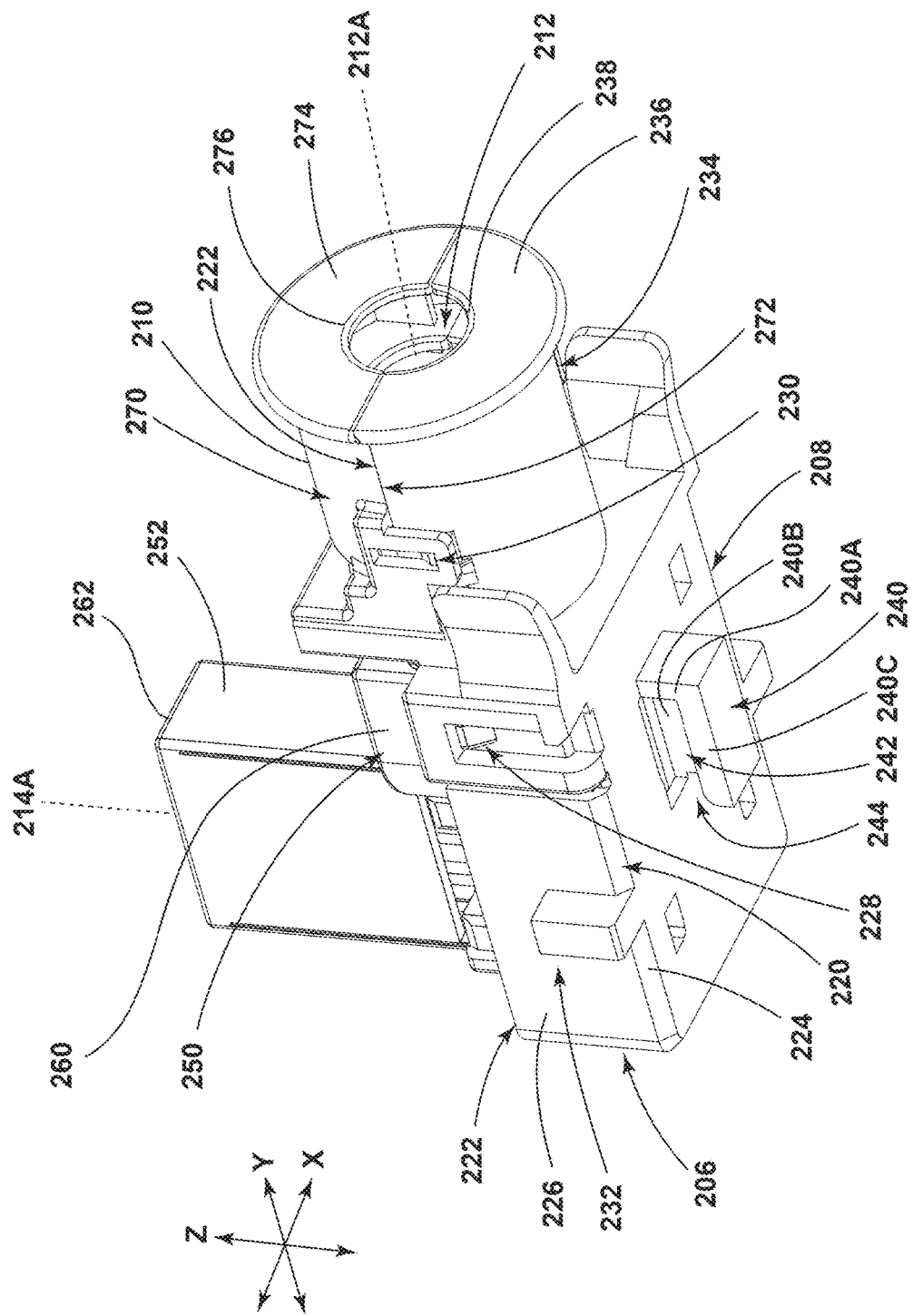

In embodiments, such as generally illustrated in FIGS. 5B, 6C, and 6D, a base portion 206 may include a protrusion 240 configured to engage and/or receive at least a portion of a projection 184 of a housing member 126, such as to releasably connect the electrical connector 200 to the housing member 126. A protrusion 240 may be disposed on and/or connected to a base 224 of the base portion 206. A protrusion 240 may have one or more portions (e.g., a first portion 240A, a second portion 240B, and/or a third portion 240C), which may define a receptacle 242. The first and/or second portions 240A, 240B may extend from the base 224 generally downward in a Z-direction and/or may be disposed obliquely or perpendicularly relative to one another. The third portion 240C may extend obliquely or perpendicularly relative to a Z-direction, may be disposed spaced apart from the base 224, and/or may connect the first and second portions 240A, 240B. The third portion 240C may be configured to be removably received in the receptacle 186 of the projection 184 of the housing member 126, such as via the opening 188. The second portion 240B may be configured to be removably received in the slot 190 of the projection 184 of the housing member 126, such as via the opening 188. The second portion 240B, the third portion 240C, and/or the base 224 may define and/or form an opening 244 which may face away from the end wall 236 (e.g., generally in a Y-direction) and/or via which at least a portion of the projection 184 (e.g., at least a portion of the fourth portion 184D) of the housing member 126 may be inserted into and/or removed from the receptacle 242 (e.g., generally in a Y-direction) (see, e.g., FIG. 6D).

With embodiments, such as generally illustrated in FIGS. 4 and 5A, a body portion 208 may have a first body portion 250 and/or a second body portion 252, which may extend obliquely and/or perpendicular to each other such that the body portion 208 has a generally L-shaped configuration. A first body portion 250 and/or a second body portion 252 may have a generally cuboid/rectangular prism configuration. A first body portion 250 may extend substantially parallel to a Y-direction. A first body portion 250 may have a closed end 254 and an open end 256, which may be disposed opposite the closed end 254 (e.g., relative to a Z-direction). An open end 256 of a first body portion 250 may be configured to engage and/or be at least partially received in a base portion 206 (e.g., insertable into an open end 222 of a base portion 206). A first body portion 250 may include a base 258 and/or one or more walls 260. A base 258 may at least partially define the closed end 254 of the body portion 208 and/or may extend substantially perpendicular to a Z-direction. One or more walls 260 may extend from the base 258 generally in a Z-direction. The base 258 and/or one or more walls 260 may surround and/or at least partially define an internal space 216 of the electrical connector 200. A second body portion 252 may be connected to and/or integrally formed with a first body portion 250. A second body portion 252 may extend from the base 258 of the first body portion 250, such as generally in a Z-direction, and/or may be configured to engage and/or be inserted into the connector receptacle 156 of the second housing member 124. A second body portion 252 may include an end wall 262, which may be disposed opposite the first body portion 250 (e.g., relative to a Z-direction) and/or may lie substantially perpendicular to the Z-direction. The body portion 208 may include a second opening 214 that may be configured to at least partially receive the second electrical component 204 (e.g., a blade terminal, a busbar, etc.). The second opening 214 may have a generally elongated and/or rectangular shape and/or may be disposed in the end wall 262 of the second body portion 252. The body portion 208 (e.g., the second body portion 252) may include one or more positioning members 264 (see, e.g., FIGS. 6C and 6D), which may be configured to facilitate positioning the second electrical component 204 in the second body portion 252 and/or the internal space 216 (e.g., via guiding, pressing, biasing, etc. the second electrical component 204). A positioning member 264 may, for example and without limitation, include a slot, a track, a tab, and/or a tapered portion, among others.

With embodiments, such as generally illustrated in FIGS. 4 and 5A, a cover portion 210 may have a closed end 270 and an open end 272, which may be disposed opposite the closed end 270 (e.g., relative to a Z-direction). An open end 272 of a cover portion 210 may be configured to engage and/or at least partially receive a base portion 206 (e.g., the open end 222 at the second portion 234 of a base portion 206). A cover portion 210 may include an end wall 274, which may lie substantially perpendicular to the Y-direction. The cover portion 210 and/or the end wall 274 may include a recess 276 that may be configured to at least partially receive the first electrical component 202. For example, the recess 276 may extend into the end wall 274 (e.g., generally in a Z-direction), such as from an edge of the end wall 274, and/or may have a semicircular shape. The recess 276 may form at least a portion of a first opening 212 (e.g., an upper half) of an electrical connector 200. When a cover portion 210 is connected to a base portion 206 (e.g., via a snap-fit connection 230), the end wall 274 of the cover portion 210 and the end wall 236 of the base portion 206 (e.g., the second portion 234) may be aligned, coplanar, and/or in direct contact with one another such that, for example, the recess 276 of the cover portion 210 and the recess 238 of the base portion 206 collectively define the first opening 212 (e.g., to form a generally circular first opening 212).

An embodiment of a method of assembling an electrical unit 100 and/or an electrical unit housing 102 (e.g., a top down assembly method) is generally illustrated in FIGS. 6A-6E. The method may include connecting an electrical connector 200 to a housing member 126. As generally shown in FIG. 6A, connecting an electrical connector 200 to a housing member 126 may include disposing an electrical connector 200 above an open end 172 of a housing member 126, such as generally in a Z-direction. Disposing an electrical connector 200 may include aligning the electrical connector 200 above a section 174A of a support portion 174 of a housing member 126 (e.g., above a depression 174B), above a first connector recess 192A, and/or offset from a projection 184 of the housing member 126 in a Y-direction (e.g., an opening 244 of the protrusion 240 may be disposed spaced apart from and facing an opposite direction of an opening 188 of the projection 184). After the electrical connector 200 has been aligned, the electrical connector 200 may be moved and/or adjusted (e.g., linearly, straight down, etc.) into the depression 174B and/or onto the section 174A of the support portion 174 of the housing member 126 generally in a Z-direction, as generally shown in FIGS. 6B and 6C. When the electrical connector 200 is disposed in the depression 174B, the base 224 of the base portion 206 may be in contact with and/or resting on top of the projection 184 (e.g., on the fourth portion 184D), the protrusion 240 (e.g., the third portion 240C) may be in contact with and/or resting on the section 174A of the support portion 174, an opening 244 of the protrusion 240 may be disposed spaced apart from and facing an opening 188 of the projection 184, the second portion 234 of the base portion 206 and/or the cover portion 210 may be disposed at least partially within the first connector recess 192A, and/or the second portion 234 of the base portion 206 and/or the cover portion 210 may project out of the housing member 126 via the first connector recess 192A such that the end walls 236, 274 and/or the first opening 212 are disposed outside of the housing member 126.

With embodiments, such as generally illustrated in FIGS. 6C and 6D, the method may include moving, adjusting, sliding, etc. the electrical connector 200 (e.g., generally in a Y-direction) to engage the projection 184 and the protrusion 240 (see, e.g., FIG. 6D), which may releasably connect the electrical connector 200 to the housing member 126. Moving, adjusting, sliding, etc. the electrical connector 200 may be performed after placing the electrical connector 200 onto the section 174A of the support portion 174 of the housing member 126 (see, e.g., FIG. 6C). Engaging the projection 184 and the protrusion 240 may include inserting at least a portion of the projection 184 (e.g., at least a portion of the fourth portion 184D) into the receptacle 242 of the protrusion 240 via the opening 244, inserting a second portion 240B of the protrusion 240 into the slot 190 of the projection 184, and/or inserting a second and/or third portion 240B, 240C of the protrusion 240 into the receptacle 186 of the projection 184 via the opening 188. When the projection 184 and the protrusion 240 are engaged, the end wall 236 of the base portion 206 and/or the end wall 262 of the cover portion 210 may be in contact with (e.g., disposed flush against) a wall 152 of the housing member 126 such that, for example, the end walls 236, 274 and/or the first opening 212 are disposed outside of the housing member 126.

With embodiments, such as generally illustrated in FIG. 6E, the method may include engaging and/or connecting (e.g., crimping, soldering, etc.) the first electrical component 202 and the electrical connector 200 together, which may include connecting the first electrical component with a conductor assembly 218 (e.g., a terminal) of the electrical connector 200. Connecting the first electrical component 202 and the electrical connector 200 may include moving and/or adjusting a first electrical component 202 (e.g., generally in a Y-direction) into the internal space 216 of the electrical connector 200 via the first opening 212. In at least some examples, the electrical connector 200 and the first electrical component 202 may be connected together prior to disposing the electrical connector 200 above the housing member 126 (e.g., prior to FIG. 6A), prior to engaging the projection 184 and the protrusion 240 (e.g., prior to FIGS. 6B-6D), prior to connecting an inner housing assembly 130 to the electrical connector 200 and/or the housing member 126 (e.g., prior to FIG. 6E), and/or prior to engaging the electrical connector 200 with the second electrical component 204. For example, the first electrical component 202 may be connected to a conductor assembly 218 and then inserted into the base portion 206. The body portion 208 and/or the cover portion 210 may then be assembled on the base portion 206.

With embodiments, such as generally illustrated in FIG. 6E, the method may include (e.g., releasably) connecting an inner housing assembly 130 to the electrical connector 200 and/or the housing member 126, which may be performed before, during, and/or after connecting the first electrical component 202 and the electrical connector 200. Connecting the inner housing assembly 130 to the housing member 126 may include moving and/or adjusting (e.g., linearly, straight down, etc.) the inner housing assembly 130 onto the housing member 126 and/or the electrical connector 200 generally in a Z-direction. Moving and/or adjusting the inner housing assembly 130 may include inserting at least a portion of the second body portion 252 of the electrical connector 200 into the connector receptacle 156 of the second housing member 124, which may cause the electrical connector 200 to engage the second electrical component 204. Engaging the electrical connector 200 and the second electrical component 204 may include inserting at least a portion of a second electrical component 204 into the internal space 216 of the electrical connector 200 via the second opening 214, such as to provide an electrical connection between the second electrical component 204 and the conductor assembly 218 and/or the first electrical component 202. One or more positioning members 264 may guide the second electrical component 204 to a position in the internal space 216 when inserting the second electrical component 204 into the internal space 216. The method may, additionally and/or alternatively, include inserting the electrical connector assemblies 104A, 104B into a respective assembly receptacle 180A, 180B of the housing member 126, such as prior to connecting an inner housing assembly 130 to the housing member 126.

With embodiments, such as generally illustrated in FIG. 6F, engaging and/or connecting the first electrical component 202 and/or the second electrical component 204 to the electrical connector 200 as described above may include connecting (e.g., mechanically, electrically, etc.) the first electrical component 202 and the second electrical component 204 together. Connecting the electrical components 202, 204 together may include adjusting and/or moving one or more of the electrical components 202, 204 into direct contact with one another. In some examples, the second electrical component 204 may be adjusted/moved into direct contact with the first electrical component 202 in the internal space 216 when the second electrical component 204 is inserted into the second opening 214 and/or the second body portion 252 is inserted into the connector receptacle 156. In other examples, the first electrical component 202 may be adjusted/moved into direct contact with the second electrical component 204 in the internal space 216 when the first electrical component 202 is inserted into the first opening 212. Additionally and/or alternatively, connecting the electrical components 202, 204 may include indirectly connecting the electrical components 202, 204, such as by adjusting and/or moving one or more of the electrical components 202, 204 into direct contact with one or more conductors and/or a conductor assembly 218 of the electrical component 200 (e.g., when inserting the first electrical component 202 into the first opening 212 and/or when inserting the second electrical component 204 into the second opening 214).

With embodiments, such as generally illustrated in FIG. 6E, the method may include connecting, securing, fixing, etc. the inner housing assembly 130 to the housing member 126 via one or more fasteners 114 after the inner housing assembly 130 has been connected to the housing member 126. As the electrical connector 200 may be disposed partially in the connector receptacle 156 and may rest on the section 174A of the support portion 174 of the housing member 126, connecting, securing, fixing, etc. the inner housing assembly 130 to the housing member 126 via one or more fasteners 114 (e.g., a single bolt 114) may connect, couple, and/or fix the electrical connector 200 to the electrical unit housing 102 and/or electrical unit 100. As such, several potential elements/components 104A, 104B, 112, 122, 124, 126, 200, etc. of the electrical unit 100 and/or the electrical unit housing 102 may be substantially connected, coupled, and/or fixed together in a single step, which may facilitate assembly of the electrical unit 100 and/or the electrical unit housing 102. The cover 120 may, subsequently for example, be disposed on and/or over the second cover 122 and the cover 120 connected to the housing member 126 such as via one or more connectors 128 that may be integrally formed with the housing member 126 and/or the cover 120. Disassembling an electrical unit 100 and/or an electrical unit housing 102 and/or disconnecting the electrical connector 200 from the electrical unit housing 102 may include performing one or more of the above described processes in reverse.

While embodiments are generally illustrated with the housing member 126 including the projection 184 and the electrical connector 200 including the protrusion 240, embodiments may also include the opposite configuration or a combination/mixture of projection/protrusion configurations.

While embodiments are generally illustrated with one electrical connector 200, electrical units 100 may include other numbers of electrical connectors 200.

Embodiments of an electrical unit 100 may involve less complicated assembly than other electrical units. For example, a first electrical component 204 may not be fixed to a post of the housing member 126 with a separate nut and/or the housing member 126 may not be formed with or connected to a post, which may reduce external components, eliminate a nut tightening step, and/or simplify formation of the housing member 126.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements, relative movement between elements, direct connections, indirect connections, fixed connections, movable connections, operative connections, indirect contact, and/or direct contact. As such, joinder references do not necessarily imply that two elements are directly connected/coupled and in fixed relation to each other. Connections of electrical components, if any, may include mechanical connections, electrical connections, wired connections, and/or wireless connections, among others. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

What is claimed is:

1. An electrical connector, comprising:
    an L-shaped body portion including:
        a first body portion extending substantially in a first direction; and
        a second body portion extending from the first body portion substantially in a second direction oblique or perpendicular to the first direction; and
    a base portion including a protrusion configured to engage a projection of a housing member to selectively connect the base portion to said housing member;
    wherein the first body portion is connected to the base portion to define an internal space in which a first electrical component and a second electrical component are electrically connectable to each other;
    the base portion at least partially defines a first opening via which said first electrical component is insertable into the internal space; and
    the second body portion includes a second opening via which said second electrical component is insertable into the internal space.

2. The electrical connector of claim 1, wherein:
    the protrusion extends from the base portion substantially in the second direction;
    the protrusion defines a receptacle configured to receive at least a portion of said projection; and
    at least a portion of a protrusion is configured to be received in a receptacle of said projection.

3. The electrical connector of claim 2, wherein the protrusion of the base portion is configured to receive said projection of said housing member in the first direction.

4. The electrical connector of claim 2, wherein:
    the protrusion of the base portion includes a first portion and a second portion that extend from the base portion substantially in the second direction;
    the protrusion of the base portion includes a third portion that extends obliquely or perpendicularly to the second direction and that connects the first portion and the second portion of the protrusion; and
    the second portion of the protrusion is configured to be received in a slot of said projection.

5. The electrical connector of claim 1, including a cover portion connected to the base portion, wherein:
    the cover portion includes a first recess;
    the base portion includes a second recess; and
    the first recess and the second recess form the first opening.

6. The electrical connector of claim 5, wherein:
    the cover portion includes a first end wall in which the first recess is disposed;
    the base portion includes a second end wall in which the second recess is disposed; and
    the first end wall and the second end wall are disposed substantially coplanar and in contact with each other.

7. The electrical connector of claim 5, wherein:
    the cover portion and the base portion are releasably connectable together via a first snap-fit connection; and
    the first body portion and the base portion are releasably connectable together via a second snap-fit connection.

8. The electrical connector of claim 1, wherein:
    the base portion has an open end facing the first body portion;
    the first body portion has an open end facing the base portion; and
    the open end of the first body portion is disposed in the open end of the base portion.

9. The electrical connector of claim 1, wherein the second body portion includes a plurality of positioning members configured to position said second electrical component within the internal space.

10. The electrical connector of claim 1, wherein the first opening is substantially circular and said first electrical component comprises a power cable.

11. The electrical connector of claim 1, wherein the second opening is substantially rectangular and said second electrical component comprises a substantially planar terminal.

12. An electrical unit, comprising:
    a housing member including a projection;
    an internal housing assembly including a circuit board; and
    an electrical connector including an L-shaped body portion and a base portion;
    wherein the body portion includes (i) a first body portion extending substantially in a first direction, and (ii) a second body portion extending from the first body portion substantially in a second direction oblique or perpendicular to the first direction;
    the base portion includes a protrusion configured to engage the projection of the housing member to connect the electrical connector to the housing member;
    the first body portion is connected to the base portion to define an internal space in which a first electrical component and a second electrical component are electrically connectable to each other;
    the base portion at least partially defines a first opening via which said first electrical component is insertable into the internal space;
    the second electrical component is connected to the circuit board;
    the second body portion includes a second opening; and
    the second electrical component extends through the second opening and into the internal space.

13. The electrical unit of claim 12, wherein the electrical connector is slidably connectable to the housing member via engaging the protrusion of the electrical connector and the projection of the housing member.

14. The electrical unit of claim 12, wherein:

the housing member includes a support portion and a plurality of wall portions extending from the support portion to define an interior space;

the housing member includes a connector recess disposed in a wall portion of the plurality of wall portions; and a portion of the electrical connector projects out of the housing member via the connector recess such that the first opening is disposed outside of the housing member.

15. The electrical unit of claim 14, wherein:

the housing member includes two assembly receptacles disposed in the support portion and that are configured to receive a respective connector assembly; and the projection is disposed on the support portion between the two assembly receptacles.

16. The electrical unit of claim 12, wherein:

the housing member, the electrical connector, and the internal housing assembly are disposed in a stacked configuration such that the electrical connector is disposed at least partially between the housing member and the internal housing assembly; and a fastener extends through the internal housing assembly and engages the housing member to secure the electrical connector between the housing member and the internal housing assembly.

17. The electrical unit of claim 12, wherein:

the protrusion of the electrical connector defines a receptacle; and the projection of the housing member includes (i) at least one portion that extends from the housing member substantially parallel to the second direction and (ii) another portion that extends substantially parallel to the first direction and is configured to be received in the receptacle when the protrusion and the projection are engaged.

18. The electrical unit of claim 17, wherein:

the protrusion of the electrical connector includes a first portion and a second portion that extend from the base portion substantially parallel to the second direction;

the protrusion of the electrical connector includes a third portion that extends obliquely or perpendicularly to the second direction and that connects the first portion and the second portion of the protrusion; and the projection of the housing member includes a slot configured to receive the second portion of the protrusion when the protrusion and the projection are engaged.

19. The electrical unit of claim 12, wherein the internal housing assembly includes a connector receptacle in which the second body portion of the electrical connector is at least partially disposed.

20. The electrical unit of claim 19, wherein:

the second electrical component is a planar terminal and projects from the circuit board into the connector receptacle; and the second electrical component is disposed within the second opening of the electrical connector and electrically connected to said first electrical component.

* * * * *